(12) United States Patent
Lin

(10) Patent No.: US 6,998,313 B2
(45) Date of Patent: Feb. 14, 2006

(54) STACKED GATE FLASH MEMORY DEVICE AND METHOD OF FABRICATING THE SAME

(75) Inventor: Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 52 days.

(21) Appl. No.: 10/733,626

(22) Filed: Dec. 11, 2003

(65) Prior Publication Data

US 2004/0121540 A1   Jun. 24, 2004

(30) Foreign Application Priority Data

Dec. 17, 2002 (TW) ................. 91136415 A

(51) Int. Cl.
*H01L 21/336*   (2006.01)

(52) U.S. Cl. .................. 438/270; 438/700; 438/257

(58) Field of Classification Search ........... 438/270, 438/700, 680, 681, 689, 692, 589, 593, 733, 438/738, 706, 745, 263, 264, 257, 259, 267, 438/286, 289, 663

See application file for complete search history.

(56) References Cited

U.S. PATENT DOCUMENTS

| | | | |
|---|---|---|---|
| 6,093,606 A * | 7/2000 | Lin et al. ............. | 438/259 |
| 6,548,856 B1 * | 4/2003 | Lin et al. ............. | 257/315 |
| 6,605,506 B1 * | 8/2003 | Wu ..................... | 438/257 |
| 6,818,948 B1 * | 11/2004 | Lin ..................... | 257/330 |

* cited by examiner

*Primary Examiner*—David Nhu
(74) *Attorney, Agent, or Firm*—Quintero Law Office

(57) ABSTRACT

A stacked gate flash memory device and method of fabricating the same. A cell of the stacked gate flash memory device is disposed in a cell trench within a substrate to achieve higher integration of memory cells.

24 Claims, 15 Drawing Sheets

STACKED GATE FLASH MEMORY DEVICE AND METHOD OF FABRICATING THE SAME

BACKGROUND OF THE INVENTION

1. Field of the Invention

The present invention relates to a semiconductor device and method of fabricating the same. More particularly, it relates to a stacked gate flash memory device that can achieve high memory cell capacity.

2. Description of the Related Art

Complementary metal oxide semiconductor (CMOS) memory is generally categorized into two groups: random access memory (RAM) and read only memory (ROM). RAM is a volatile memory, wherein the stored data is erased when power is turned off. On the contrary, turning off power does not affect the stored data in a ROM.

In the past few years, market share of ROM has been continuously expanding, and the type attracting the most attention has been flash memory. The fact that a single memory cell is electrically programmable and multiple memory cell blocks are electrically erasable allows flexible and convenient application, superior to electrically programmable read only memory (EPROM), electrically erasable programmable read only memory (EEPROM) and programmable read only memory (PROM). Furthermore, fabricating flash memory is cost effective. Having the above advantages, flash memory has been widely applied in consumer electronic products, such as digital cameras, digital video cameras, mobile phones, notebooks, personal stereos and personal digital assistants (PDA).

Since portability of these electrical consumer products is strongly prioritized by consumers, the size of the products must be minimal. As a result, capacity of flash memory must increase, and functions must be maximized while size thereof is continuously minimized. Having an increased amount of access data, capacity of memory cells has been enhanced from 4 to 256 MB, and even 1 G byte will become the market trend in the near future.

Hence, there is a need for a flash memory device with high memory cell capacity.

SUMMARY OF THE INVENTION

Accordingly, an object of the invention is to provide a stacked gate flash memory device that can achieve high integration of memory cells thereof.

Another object of the invention is to provide a method of fabricating a stacked gate flash memory device, wherein the size of memory cells thereof can be reduced and the coupling ratio of the control gate to the floating gate can be also increased.

Thus, a cell of the stacked gate flash memory device in accordance with the present invention includes two symmetrical memory structures therein. The cell comprises a substrate having a trench therein. A conductive layer is disposed on the bottom of the trench. A pair of source regions are each disposed in the substrate adjacent to one sidewall of the trench, electrically connecting the conductive layer. A source isolation layer is disposed on the conductive layer. A pair of tunnel oxide layers are each respectively disposed on one sidewall of the trench, contacting the source regions thereby. A pair of floating gates respectively disposed on the source isolation layer contacts the tunnel oxide layers thereby. A pair of inter-gate dielectric layers respectively overlie the floating gate thereby. A pair of control gates respectively overlie the inter-gate dielectric layer thereby. An insulating layer is disposed in the trench, isolating the two control gates, forming two symmetrical memory structures therein and a drain region is disposed in the substrate adjacent to the trench.

The method of fabricating memory cells of the stacked gate flash memory device in accordance with the present invention comprises providing a substrate, forming a plurality of parallel long trenches along a first direction in the substrate, forming a conductive layer and a pair of source regions on the bottom of each long trench, wherein the source regions are respectively disposed in the substrate adjacent to two sidewalls of each long trench and electrically connected to the conductive layer, forming a source isolation layer on each conductive layer, forming a tunnel oxide layer on two sidewalls of each long trench, contacting the source region thereby, forming a pair of floating gates on the source isolation layer, respectively contacting the tunnel oxide layer, forming a pair of inter-gate dielectric layers, respectively overlying the floating gate, forming a pair of control gates, respectively overlying the inter-gate dielectric layer, forming an insulating layer in each long trench, isolating the control gates, forming a plurality of parallel shallow trench isolation (STI) regions along a second direction, defining a plurality of cell trenches and forming a drain region in the substrate adjacent to each cell trench.

In the present invention, the trench-type stacked gate flash memory device disposed in cell trenches within a substrate can achieve higher integration of memory cell capacity than that in the Prior Art.

Moreover, the control gate in the invention can be L-shaped or reverse L-shaped (⌐), the overlapping areas between the floating gate and the control gate can be larger and a higher coupling ratio to the control gate can be obtained.

In addition, most of the fabricating processes in the invention are self-aligned and additional lithography processes and number of masks for the whole fabricating process can be reduced. The complexity of fabrication is reduced and can be easily achieved. The higher coupling ratio by the memory cells also provided a lower operating voltage thereof.

Furthermore, most patterns of the masks for fabricating the stacked gate flash memory device are rectangular and can be easily fabricated. The costs of mask fabrication can be reduced and resolution limitations by the photolithography tools can be reduced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
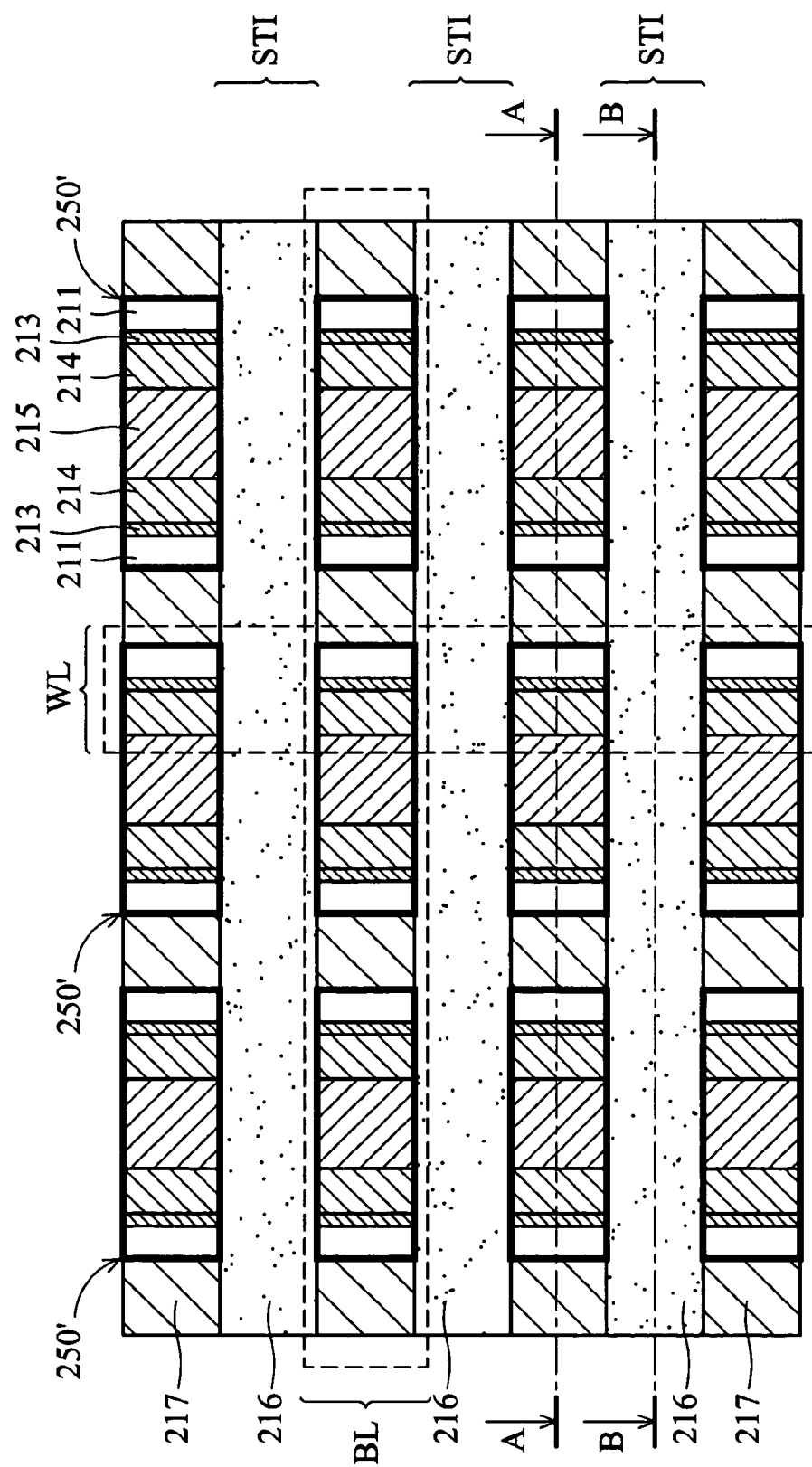
FIG. 1 is schematic top view of the stacked gate flash memory device of the invention.

The present invention provides a stacked gate flash memory device that meets the demand for increased capacity of memory cells. In FIG. 1, a top view of the stacked gate flash memory device in accordance with the present invention is shown. Each memory cell is disposed in the cell trenches (referring to trench 250') along the A~A' phantom line, between two shallow isolation trench (referring to STI) regions along the B~B' phantom line.

FIGS. 3a~3j and FIGS. 4a~4j respectively illustrate the cross-sections of a fabricating process along lines A~A' and lines B~B' according to an embodiment of the present invention. Moreover, FIGS. 2a~2d also illustrate corresponding top views of the fabricating process.

Figure 3A:
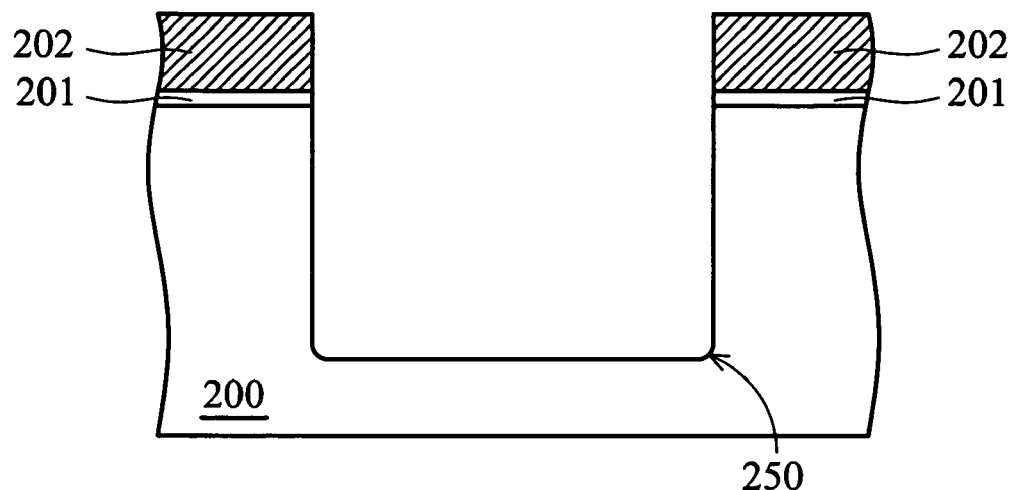
FIGS. 3a~3j are cross-sections of the fabricating process along the A–A' phantom line in FIG. 1.
Figure 3B:
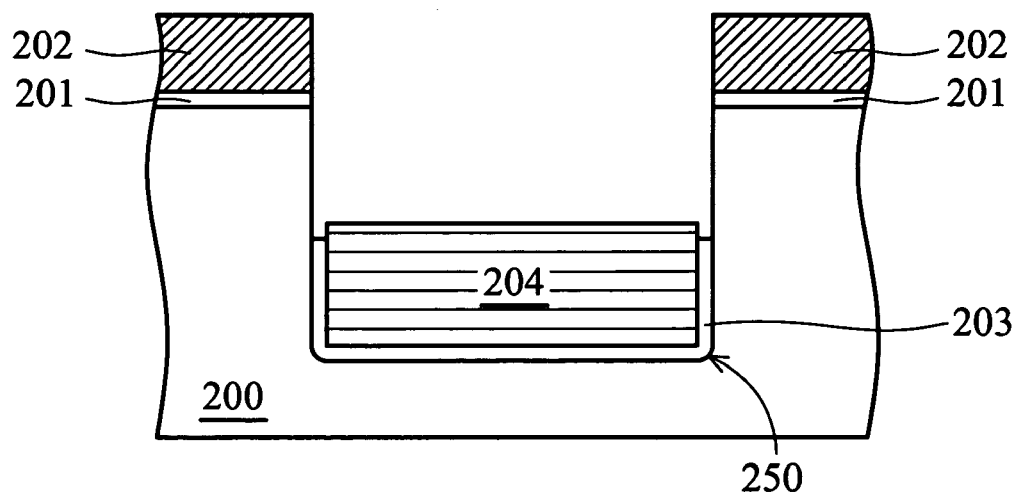
Figure 3C:
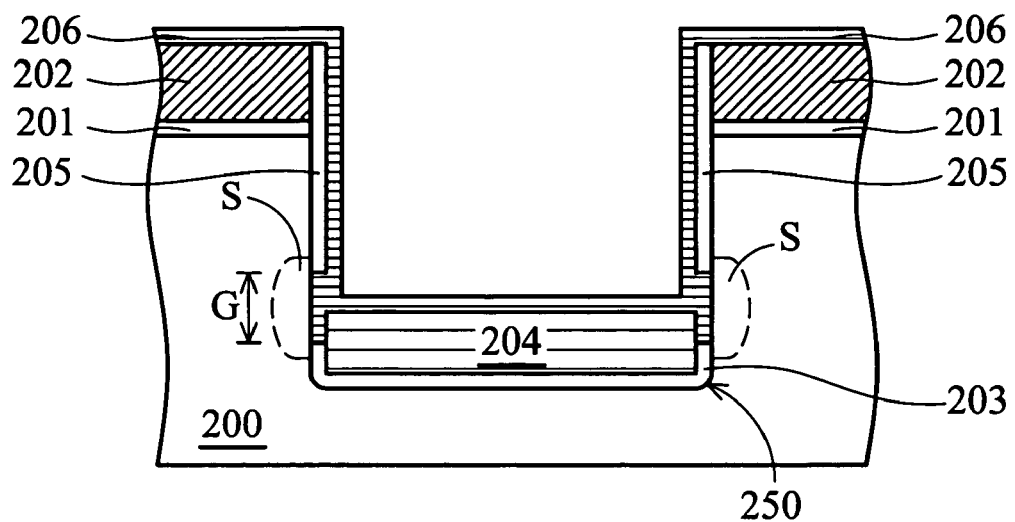
Figure 3D:
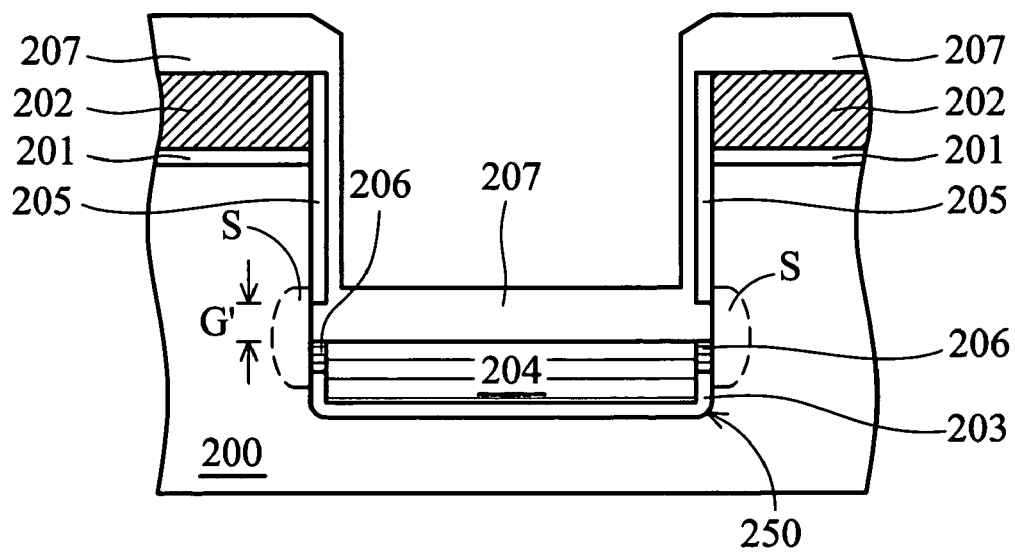
Figure 3E:
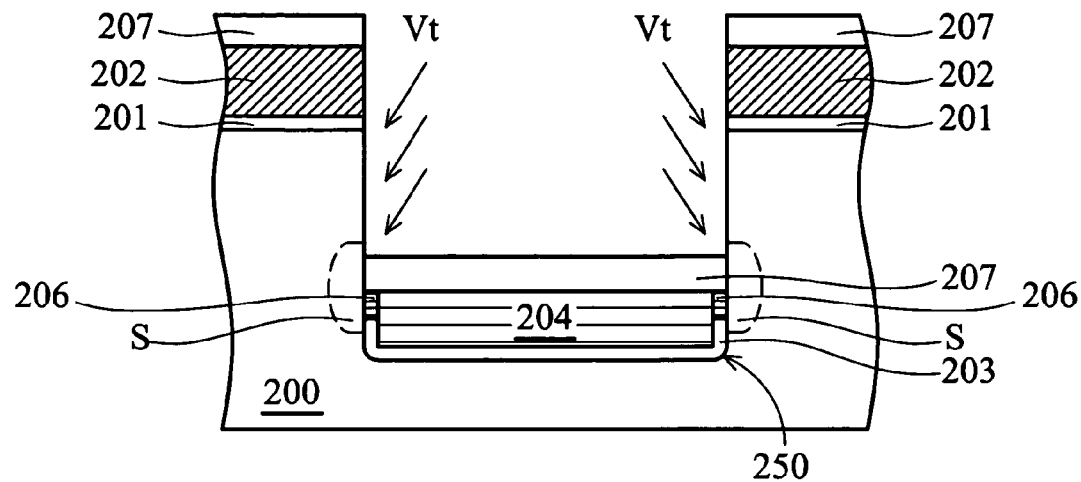
Figure 3F:
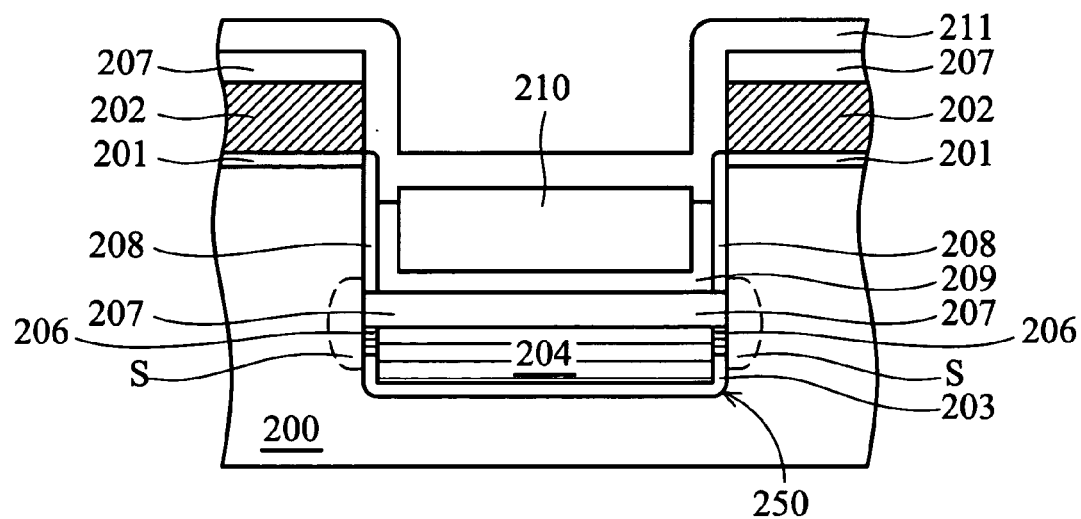
Figure 3G:
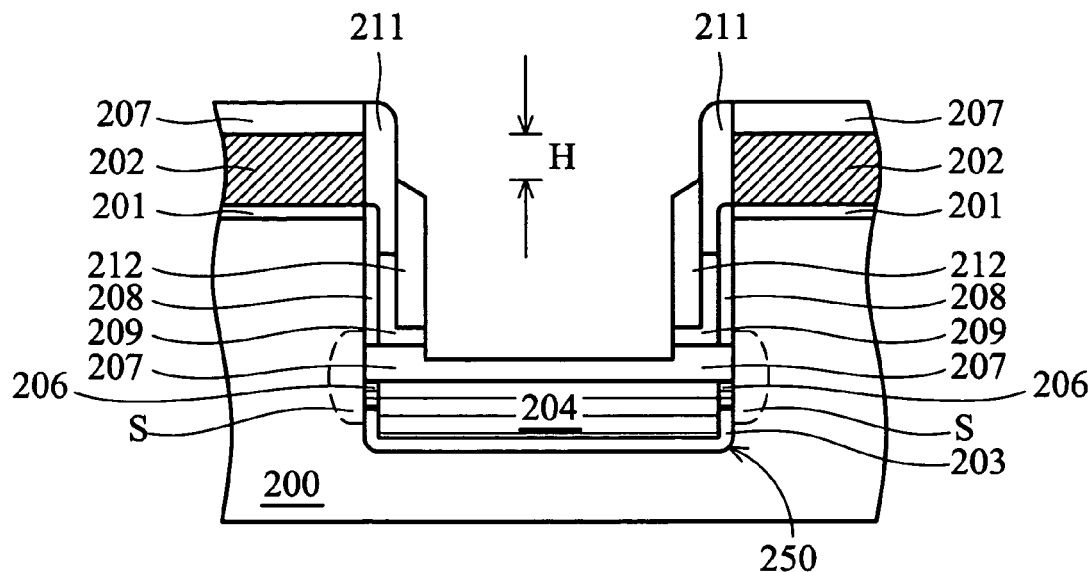
Figure 3H:
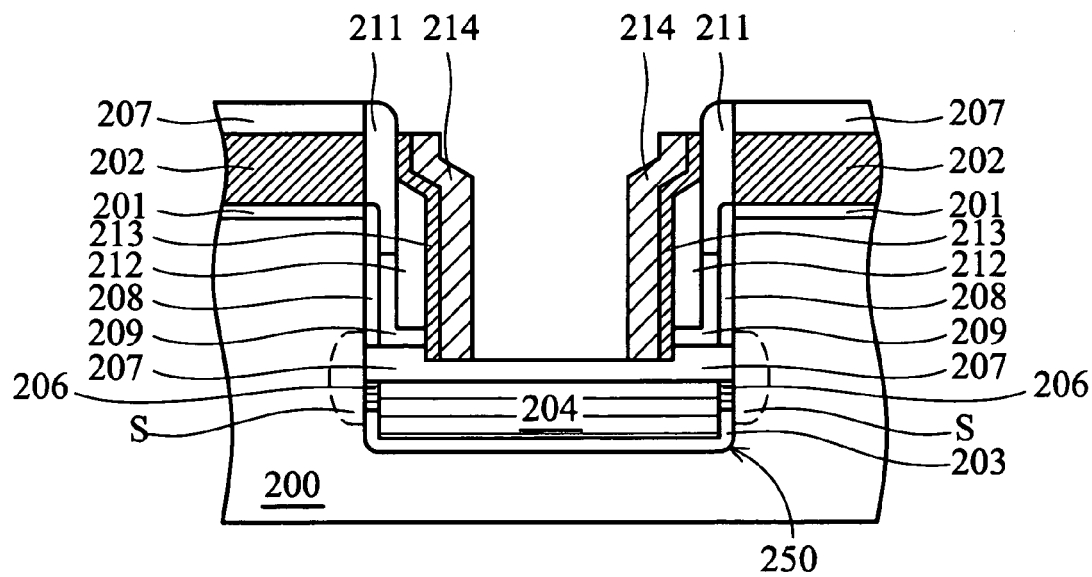
Figure 3I:
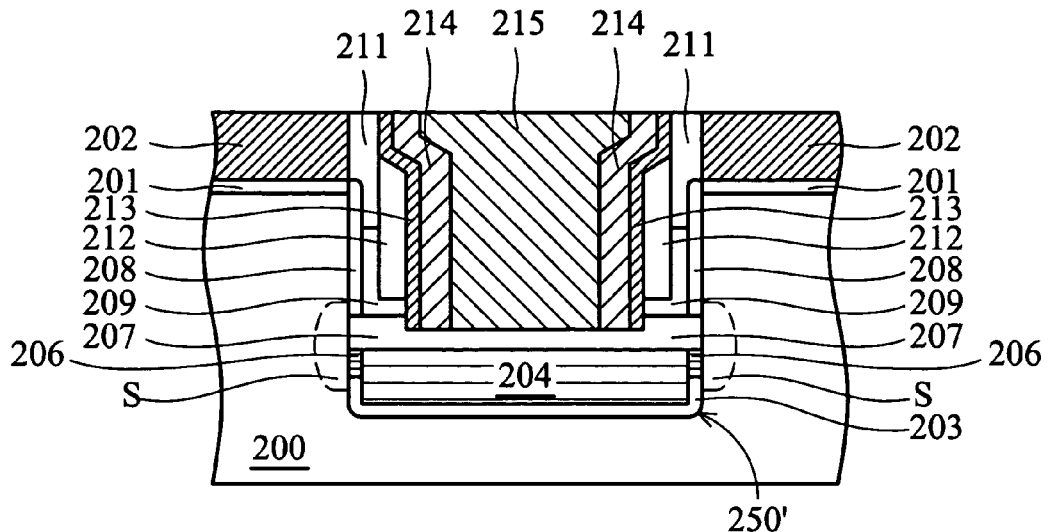
Figure 3J:
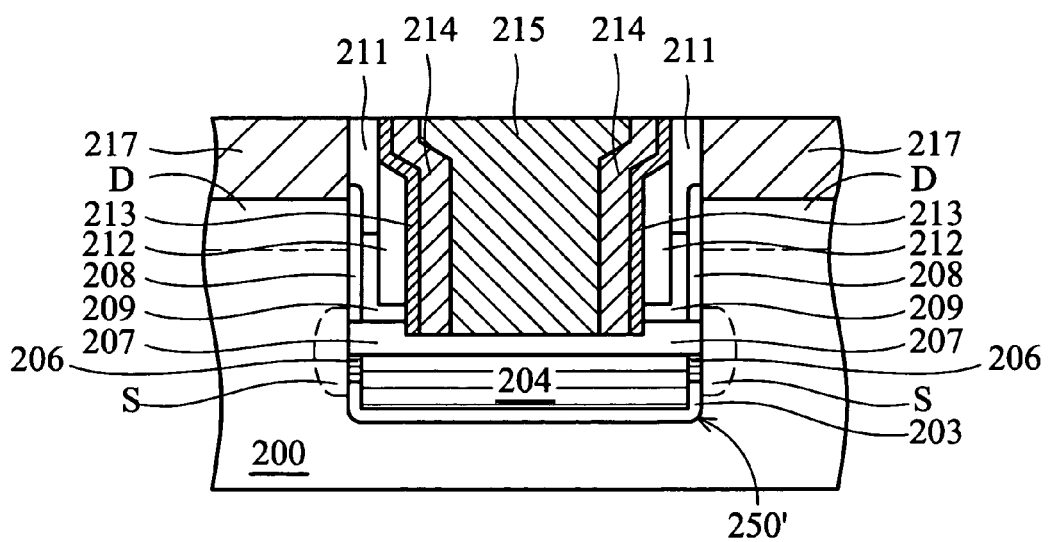

First, FIG. 3j illustrates a cross-section of the stacked gate flash memory device in accordance with the present invention. A cell of the memory device comprises a substrate 200 having a trench 250' therein. A conductive layer composed of a source material line layer 204 and two adjacent polysilicon layer 206 is disposed on the bottom of the trench 250'. A pair of source regions S is respectively disposed in the substrate 200 adjacent to one sidewall of the trench 250', electrically connecting the conductive layer. A source isolation layer (referring to the first insulating layer 207) is disposed on the conductive layer. A pair of tunnel oxide layers 208 is respectively disposed on one sidewall of the trench 250', contacting the source regions S thereby. A pair of floating gates composed of the second polysilicon layer 209 and the third polysilicon layer 212 is respectively disposed on the source isolation layer, contacting the tunnel oxide layers 208 thereby. A pair of inter-gate dielectric layer 213 respectively overlies the floating gate thereby. A pair of control gates 214, each overlies the inter-gate dielectric layer 213 thereby. An insulating layer 215 is disposed in the trench 250' to isolate the two control gates 214, and two symmetrical memory structures are formed therein, and a drain region D is disposed in the substrate 200 adjacent to the trench 250'.

Figure 2A:
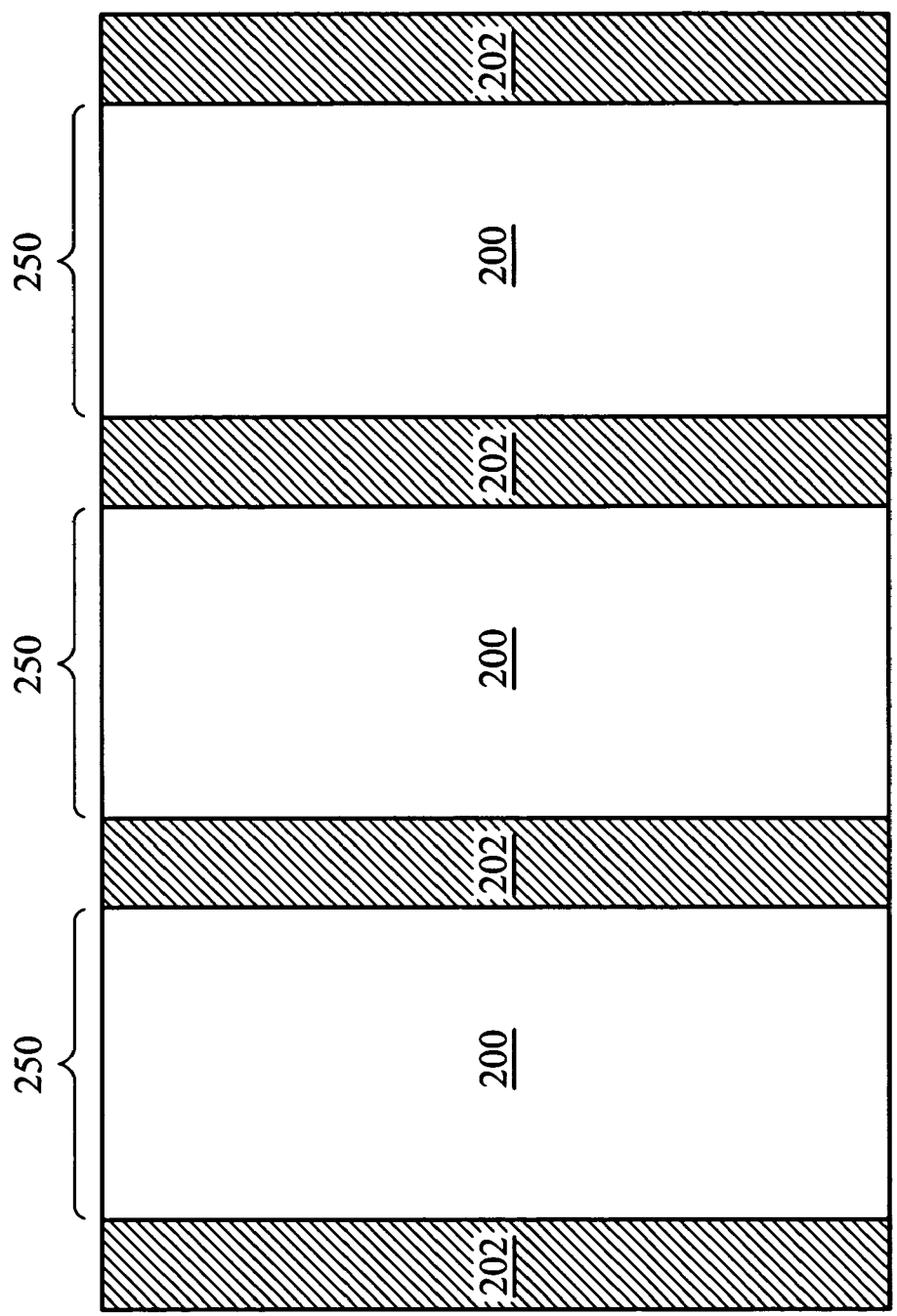
FIGS. 2a~2d are schematic top views of corresponding cross-sections for one embodiment of the invention.
Figure 4A:
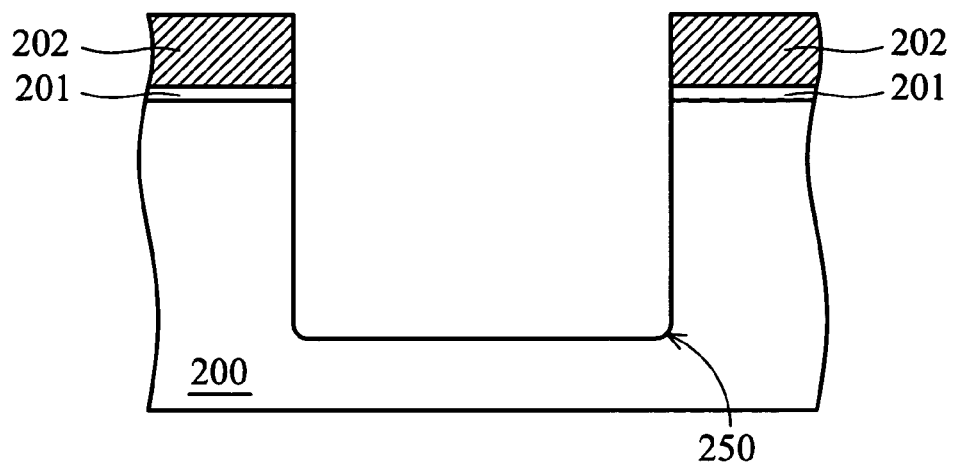
FIGS. 4a~4j are cross-sections of the fabricating process along the B–B' phantom line in FIG. 1.

In FIGS. 3a and 4a, a semiconductor substrate 200, for example a P-type silicon substrate, is provided. Next, a pad oxide layer 201 and a mask layer 202 are sequentially formed on the substrate 200 and then sequentially defined by subsequent lithography (not shown) and etching (not shown), forming a plurality of long trenches 250 with a depth about 30000 Å to 70000 Å in the substrate 200. The mask layer 202 can be, for example, a silicon nitride layer performing etching masking or CMP stopping in subsequent fabricating processes. The long trenches 250 are parallel along a first direction. This top view is shown in FIG. 2a and the depth of the long trench 250 affects the channel length of each stacked gate flash memory cell and the resistance of a source line.

Figure 2B:
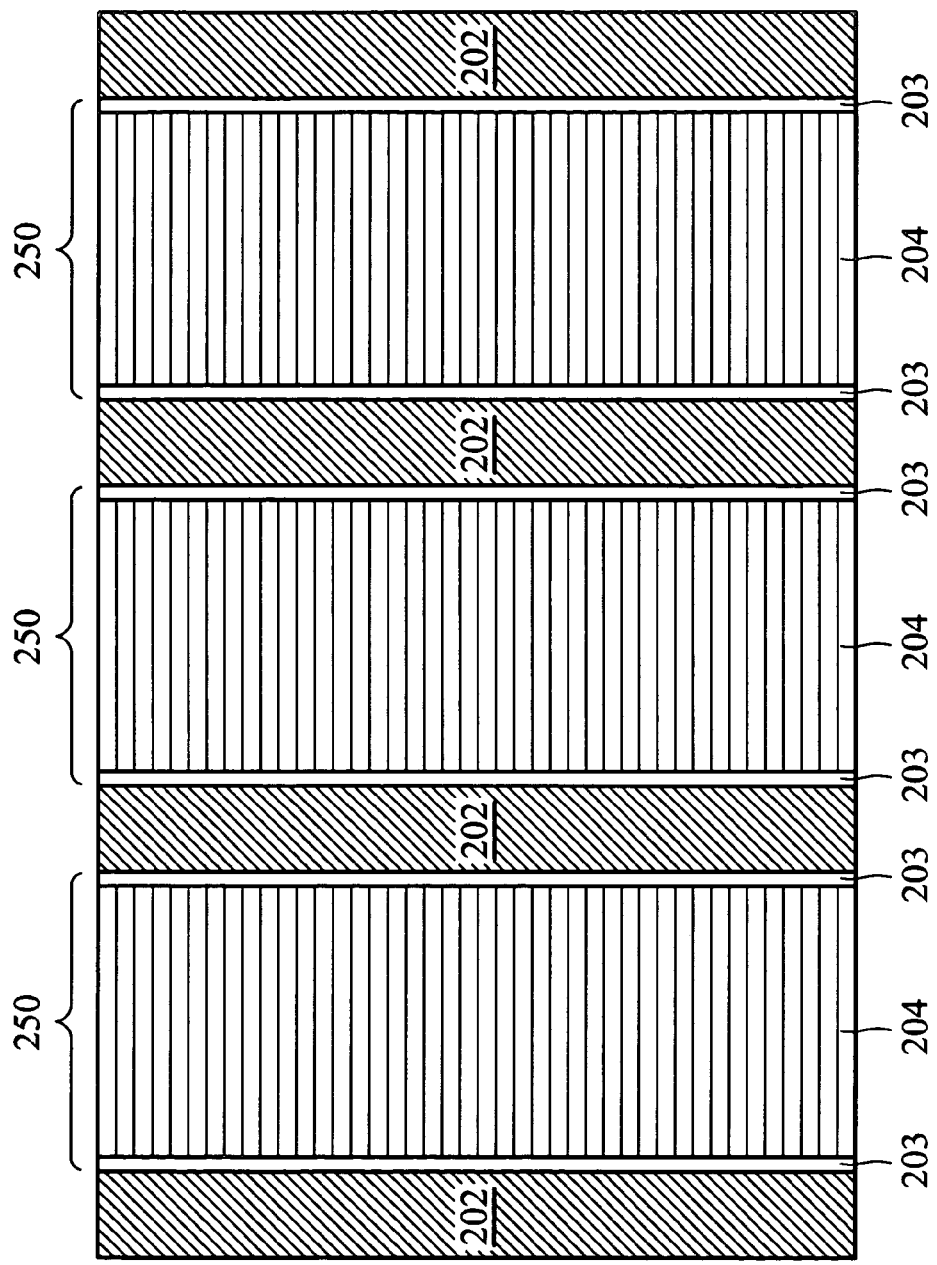
Figure 4B:
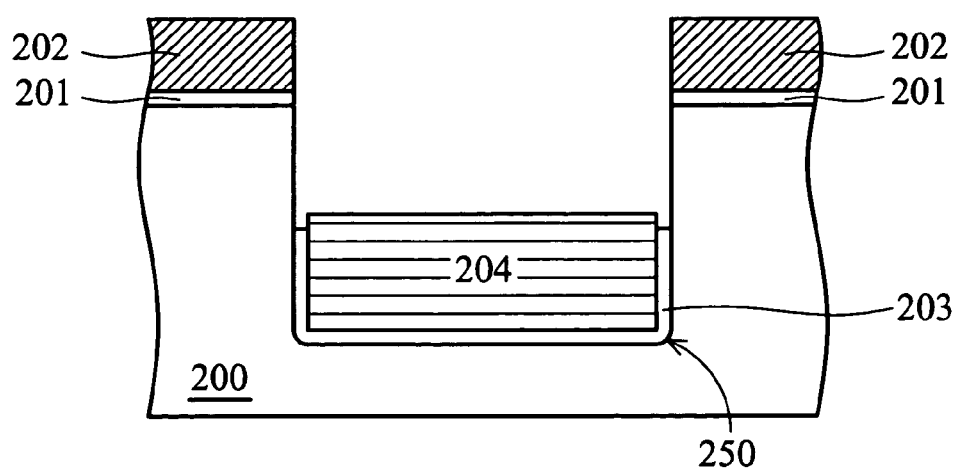

Next, in FIGS. 3b and 4b, a conformal bottom insulating layer 203 is deposited on mask layer 202 and in the long trench 250. The material of the insulating layer 203 can be, for example, silicon dioxide with a thickness of about 100 Å to 150 Å. Materials of a source line material layer 204 are then deposited on the bottom insulating layer 203 and fill the long trench 250. The material of the source line material layer 204 can be, for example, chemical vapor deposition (CVD) formed N-type dopant doped polysilicon, and preferably arsenic (As) doped polysilicon. Materials of the source line material layer 204 are then etched and recessed to a depth about 2000 Å to 5000 Å from the surface of the substrate 200 by, for example, dry etching, leaving the source line material layer 204 in the long trench 250 and exposing portions of the bottom insulating layer 203. The bottom insulating layer 203 exposed by the source line material layer 204 is then removed by, for example, wet etching. Thus, a bottom insulating layer 203 having substantially the same height as the surface of the source line material layer 204 is left in the long trench 250. This top view is shown in FIG. 2b and the bottom insulating layer 203 and the source line material layer 204 cover the bottom of each long trench 250 and the mask layer 202 covers the surfaces between the trenches 250.

Figure 4C:
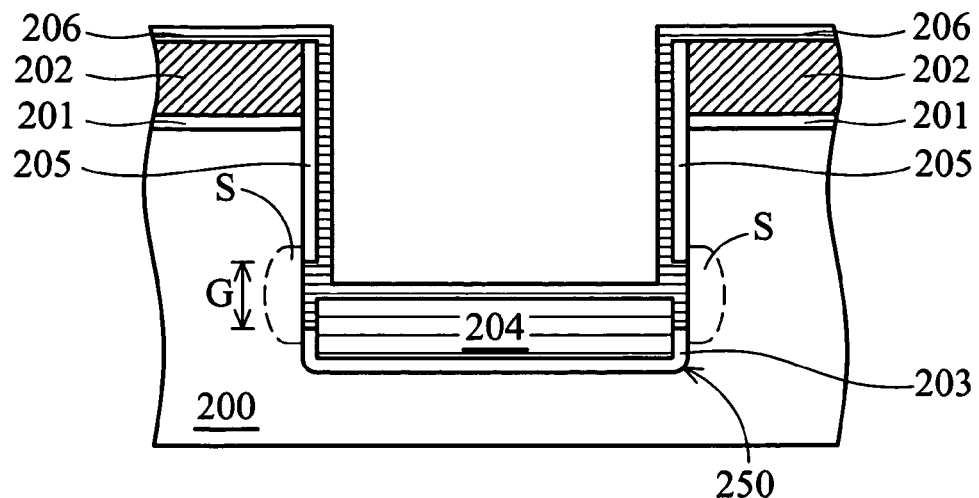

In FIGS. 3c and 4c, a conformal first spacer layer 205 is deposited on the mask layer 202 and in the long trench 250. The material of the first spacer layer 205 can be, for example, silicon nitride. Next, the conformal first spacer layer 205 is etched by, for example, dry etching leaving first spacers 205 respectively on the two sidewalls of the long trench 250. Then an etching process, for example a dry etching, is further performed to recess the source line material layer 204 in the long trench 250 and a thickness thereof of 300 Å to 800 Å is removed. Thus, portions of the bottom insulating layer 203 adjacent to the sidewalls of the long trench 250 are further exposed. Next, the exposed bottom insulating layer 203 can be removed by, for example, wet etching such that first sidewall gaps G are respectively formed on the sidewalls of the long trench 250. Next, a conformal polysilicon layer 206 is deposited on the mask layer 202 and in the long trench 250, also filling the first sidewall gaps S. Materials of the polysilicon layer 206 can be, for example, N-type dopant doped polysilicon and preferably arsenic (As) doped polysilicon. Next, a thermal annealing process (not shown), for example a furnace annealing process, is performed to drive out dopants (such as N-type dopants like arsenic) from the source line material layer 204 and the adjacent polysilicon layer 206 into the substrate 200 adjacent to the long trench 250. Thus, a pair of source regions S are respectively formed in the substrate 200.

Figure 4D:
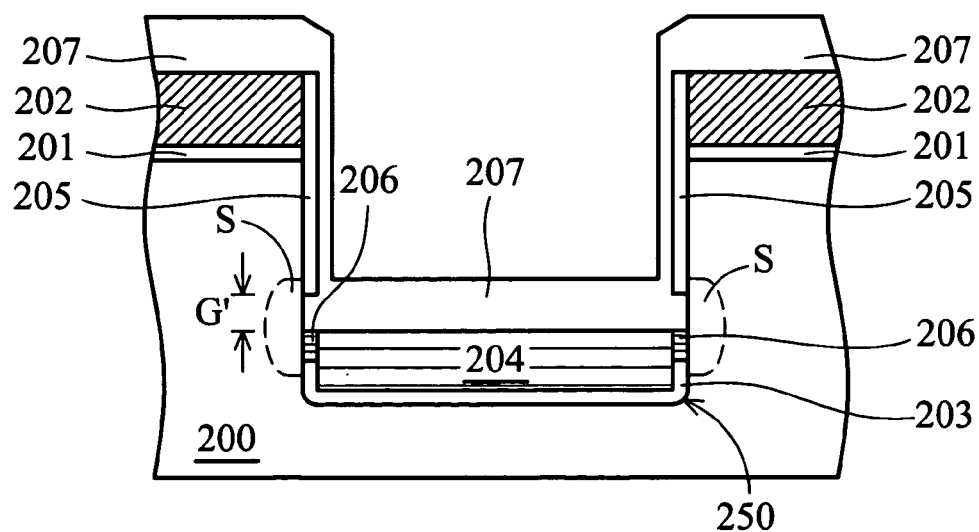

In FIGS. 3d and 4d, the polysilicon layer 206 is then isotropically etched and partially left in the lower portion of the first sidewall gap G. Thus, second sidewall gaps G' are further respectively formed on the two sidewalls of the long trench 250. Next, a conformal first insulating layer 207 is deposited on the mask layer 202 and in the long trench 250 and filled in the second sidewall gaps G'. Materials of the first insulating layer 207 can be, for example, silicon dioxide formed by sequentially performing low pressure chemical vapor deposition (LPCVD) and high density plasma chemical vapor deposition (HDP CVD). Thus, a first insulating layer 207 with a thicker horizontal portion formed on the mask layer 202 and in the long trench 250 and a thinner vertical portion formed on the sidewalls of the long trench 250 is obtained.

Figure 4E:
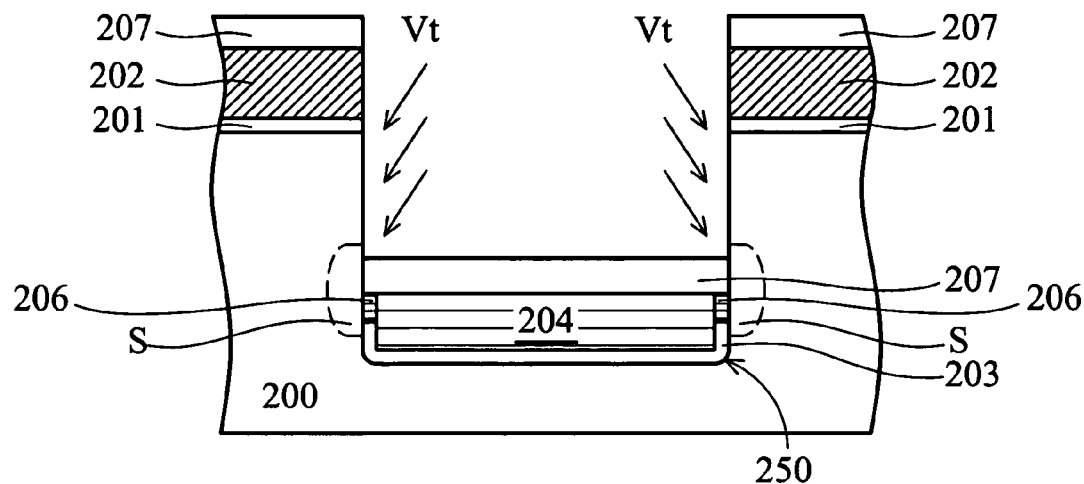

In FIG. 3e and FIG. 4e, portions of the first insulating layer 207 on the sidewalls of the long trench 250 is removed by a wet dip process (not shown). Next, the first spacers 205 are removed by, for example, wet etching. Thus, a first insulating layer 207 with a thickness of about 500 Å to 1000 Å is left on the mask layer 202 and in the long trench 250. In the long trench 250, the source line material layer 204 and the two adjacent polysilicon layer 206 under the first insulating layer 207 contain N-type dopant such as arsenic (As) and are still conductive.

Thus, a conductive layer composed of the source line material layer 204 and the two adjacent polysilicon layer 206 is formed in the long trench 250 and the first insulating layer 207 formed thereon to limit an electrical connection between the source regions S fully achieved by the conductive layer therebelow. The source regions S also respectively connect the conductive layer. Next, a threshold voltage implantation Vt is performed on sidewalls of the long trench 250 to adjust the threshold voltage of each memory cell.

Figure 4F:
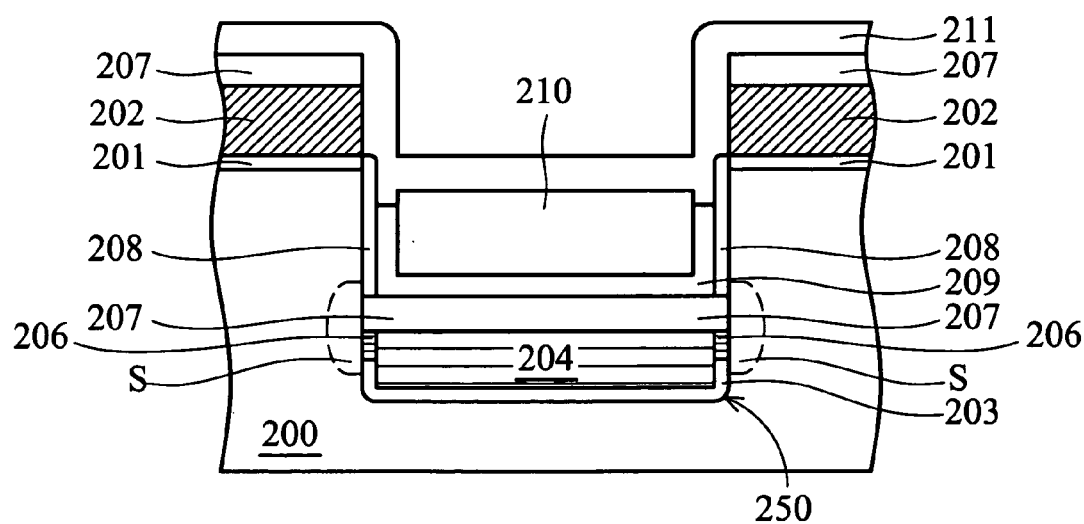

In FIG. 3f and FIG. 4f, a tunnel oxide layer 208 is respectively formed on the two sidewalls of the long trench 250. The tunnel oxide layer 208 can be, for example, silicon dioxide formed by thermal oxidation. Next, a conformal second polysilicon layer 209 is formed on the mask layer 202 and in the long trench 250, contacting the tunnel oxide layers 208 therein. Materials of the second polysilicon layer 209 can be, for example, N-type dopant (e.g. P or As ions) doped polysilicon formed by LPCVD.

Next, a protective layer 210 with a thickness of about 1000 Å to 4000 Å is formed in the long trench 250 and exposes portions of the second polysilicon layer 209. The protecting layer 210 is formed by sequential deposition, etch-back, and recession of materials such as boro-silicate-glass (BSG) formed by chemical vapor deposition (CVD). Portions of the second polysilicon layer 209 exposed by the protective layer 210 are then isotropically removed, leaving a U-shaped second polysilicon layer 209 in the long trench 250. Then a second spacer layer 211 is conformally formed on the mask layer 202 and in the long trench 250. The second spacer layer 211 can be, for example, silicon dioxide formed by LPCVD.

Figure 4G:
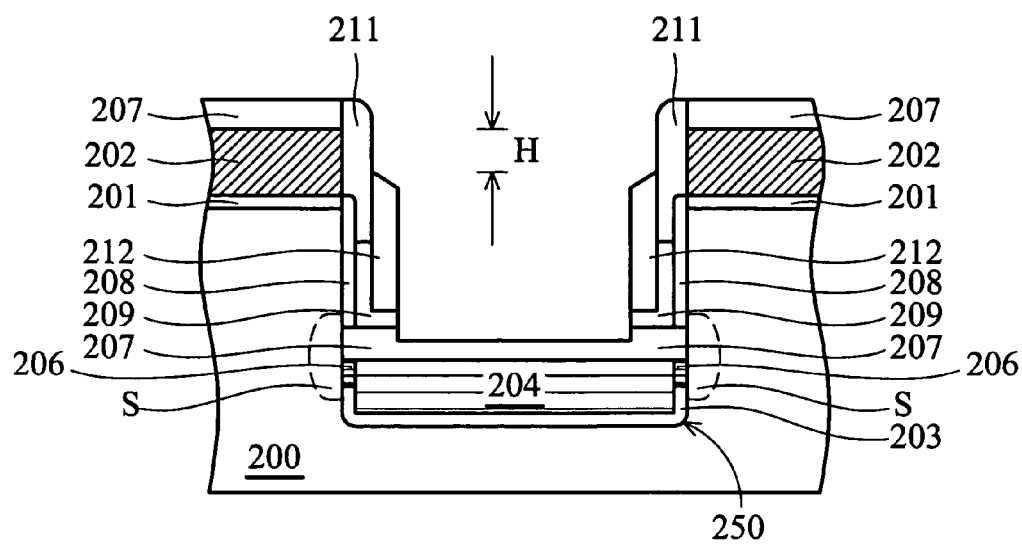

In FIGS. 3g and 4g, the second spacer layer 211 is then etched, leaving second spacers 211 respectively on the vertical portions of both sides of the U-shaped second polysilicon layer 209. Next, the protective layer 210 is removed by, for example, wet etching. The different etching rates between the materials of the second spacers 211 (e.g. silicon dioxide) and the protecting layer 210 (e.g. BSG) here, during the removal of the protective layer 210, cause the second spacer layer 211 to be lightly etched in the described removal.

Next, a third polysilicon layer 212 with a thickness of about 350 Å to 1500 Å is conformally deposited on the first insulating layer 207 and in the long trench 250, covering the second spacers 211 and the U-shaped second polysilicon layer 209. Materials of the third polysilicon layer 212 can be, for example, N-type dopant (e.g. As or P ions) doped polysilicon formed by LPCVD. Then the third polysilicon layer 212 is etched by, for example, dry etching and the second polysilicon layer 209 is also etched until the first insulating layer 207 in the long trench 250 and on the mask layer 202 are exposed. Thus, a third polysilicon layer 212 is respectively formed on the second polysilicon layer 209 on both sides of the long trench 250. A step height H of 500 Å to 1000 Å between the third polysilicon layer 212 and the mask layer 202 is formed and the third polysilicon layer 212 and the second polysilicon layer 209 thereby compose a composite polysilicon layer as a control gate. The control gate can be L-shaped or reverse L-shaped (⌐) here to provide a higher coupling ratio to a control gate.

Figure 4H:
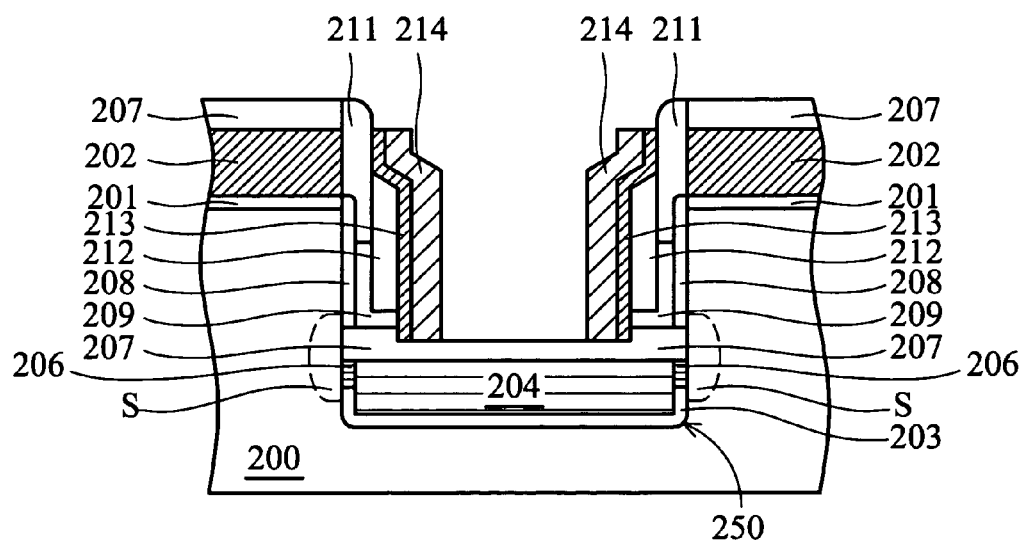

In FIG. 3h and FIG. 4h, an inter-gate dielectric layer 213 formed by, for example, CVD is conformally deposited in the long trench 250 and on the floating gates therein. Next, a control gate layer 214 formed by, for example, CVD is conformally deposited on the inter-gate dielectric layer 213. Then the conformal control gate layer 214 and the inter-dielectric layer 213 are etched by, for example, dry etching (not shown). Thus, a control gate layer 214 and inter-gate dielectric layer 213 sequentially disposed on the floating gate (composed of the second polysilicon layer 209 and the third polysilicon layer 212) and the first insulating layer 207 are formed in the long trench 250. The control gate layer 214 performs a control gate function for the flash memory cell of the invention. The material of the inter-gate dielectric layer 213 can be, for example, CVD-formed silicon dioxide with a thickness between 100 Å and 300 Å. The material of the control gate 214 can be, for example, N-type dopant doped polysilicon formed by CVD and the thickness thereof is between 350 Å and 1500 Å.

Figure 4I:
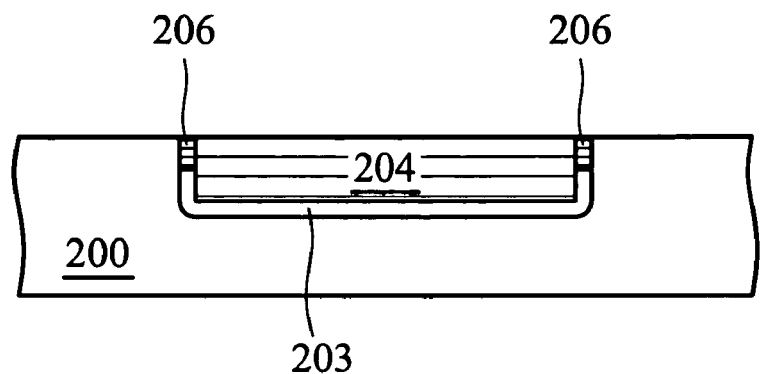

In FIG. 3i and FIG. 4i, a second insulating layer 215 is formed in the long trench 250 by sequential deposition, and CMP of insulating materials such as silicon dioxide formed by LPCVD to isolate the two memory structures symmetrical to the second insulating layer 215 composed of the described layers. The control gates (referring to the control gate layer 214) are exposed after the described CMP to connect the sequentially formed wordline (not shown).

Figure 2C:
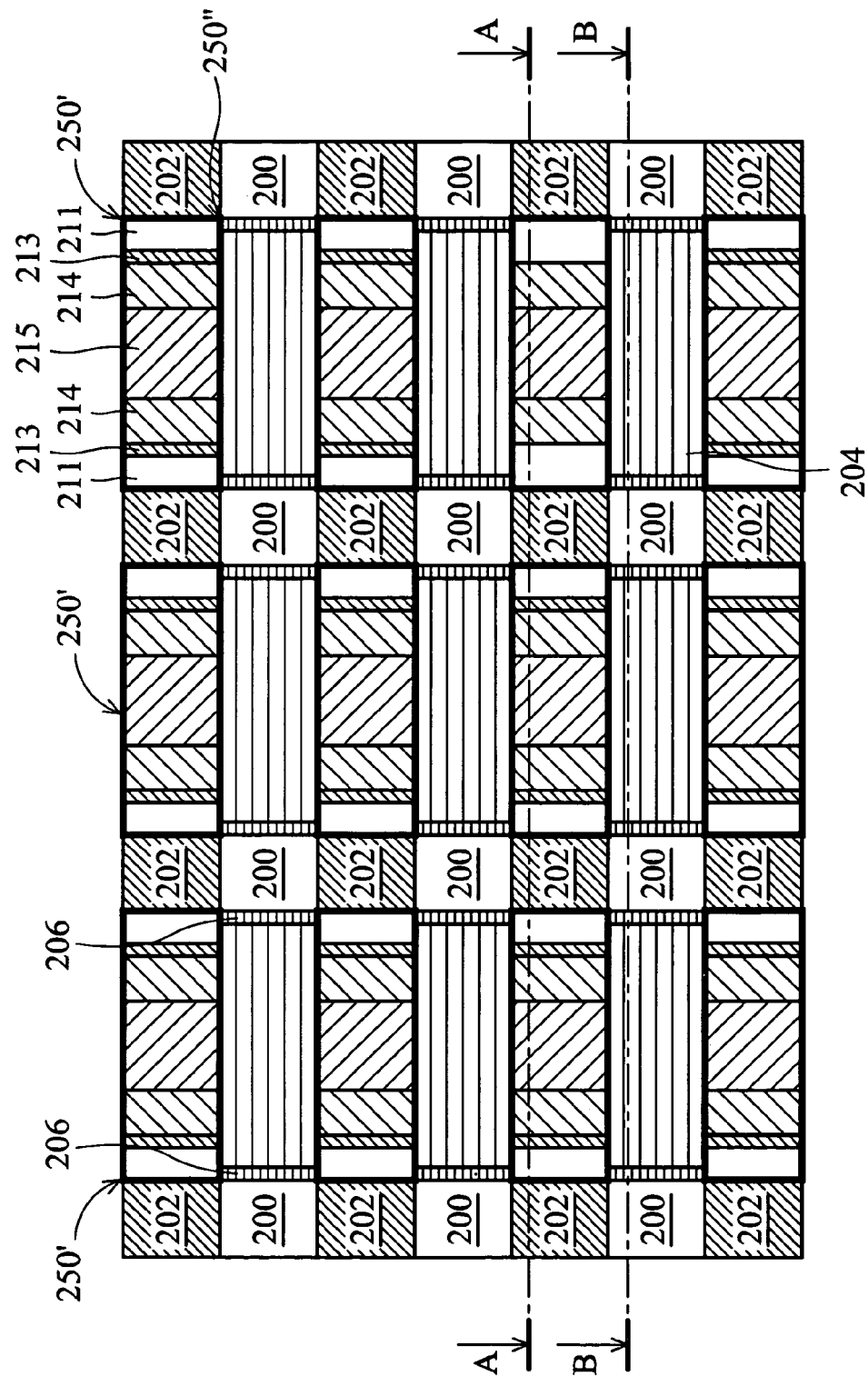

Next, a plurality of parallel long isolation trenches are formed in the substrate 200 (shown in FIG. 4i) along a second direction, perpendicular to the first direction of the long trenches 250, by sequential lithography and etching. This top view is shown in FIG. 2c, the described etching process stops at the source line material layer 204 and the adjacent polysilicon layers 206 thereof in the long trench 250. A plurality of trenches 250' including a pair of second spacers 211, inter-gate dielectric layer 213 and second control gate layer 214 symmetrical to the second insulating layer 215 are thus defined in the substrate 200.

Figure 4J:
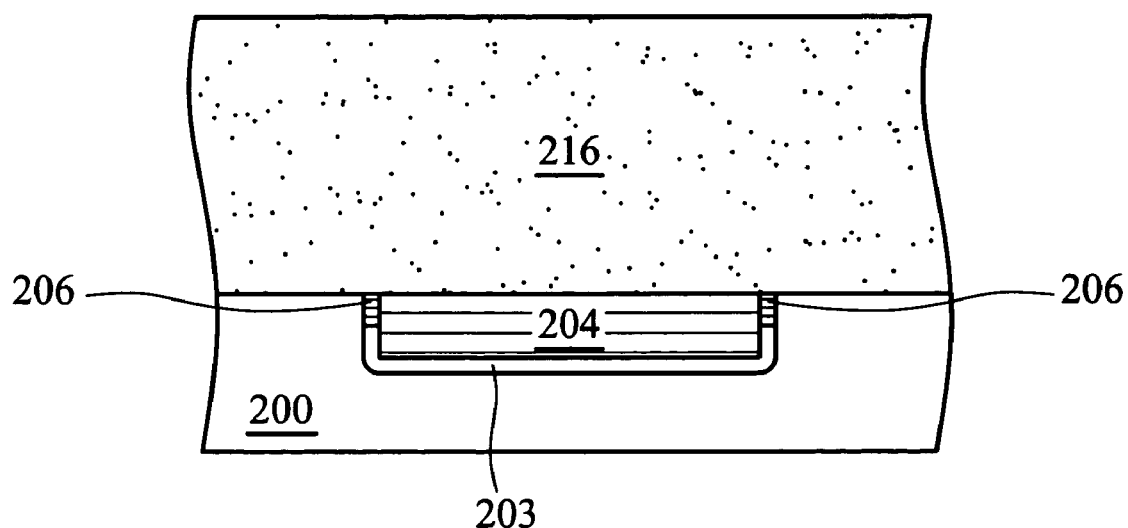

In FIG. 3j and FIG. 4j, a third insulating layer 216 is formed in the long isolation trenches by sequential deposition and CMP of insulating materials such as silicon dioxide formed by LPCVD. Then the mask layer 202 and the pad layer 201 are removed by, for example, wet etching, exposing active areas (not shown) for receiving drain implantation. Then a drain implantation (not shown) is performed on implant N-type impurities such as arsenic (As) ions into the substrate 200. Then a thermal annealing process (not shown), for example a rapid thermal annealing (RTP) process, is performed and drain regions D are thus respectively formed in the substrate 200 adjacent to each trench 250'. Then a fourth insulating layer 217 is formed on each drain region D. The fourth insulating layer 217 can be formed by sequential deposition and planarization of insulating materials such as silicon dioxide formed by high density plasma chemical vapor deposition (HDP CVD). After the planarization, the wafer surface is leveled and the control gates (the control gate layers 214) are thus exposed.

Figure 2D:
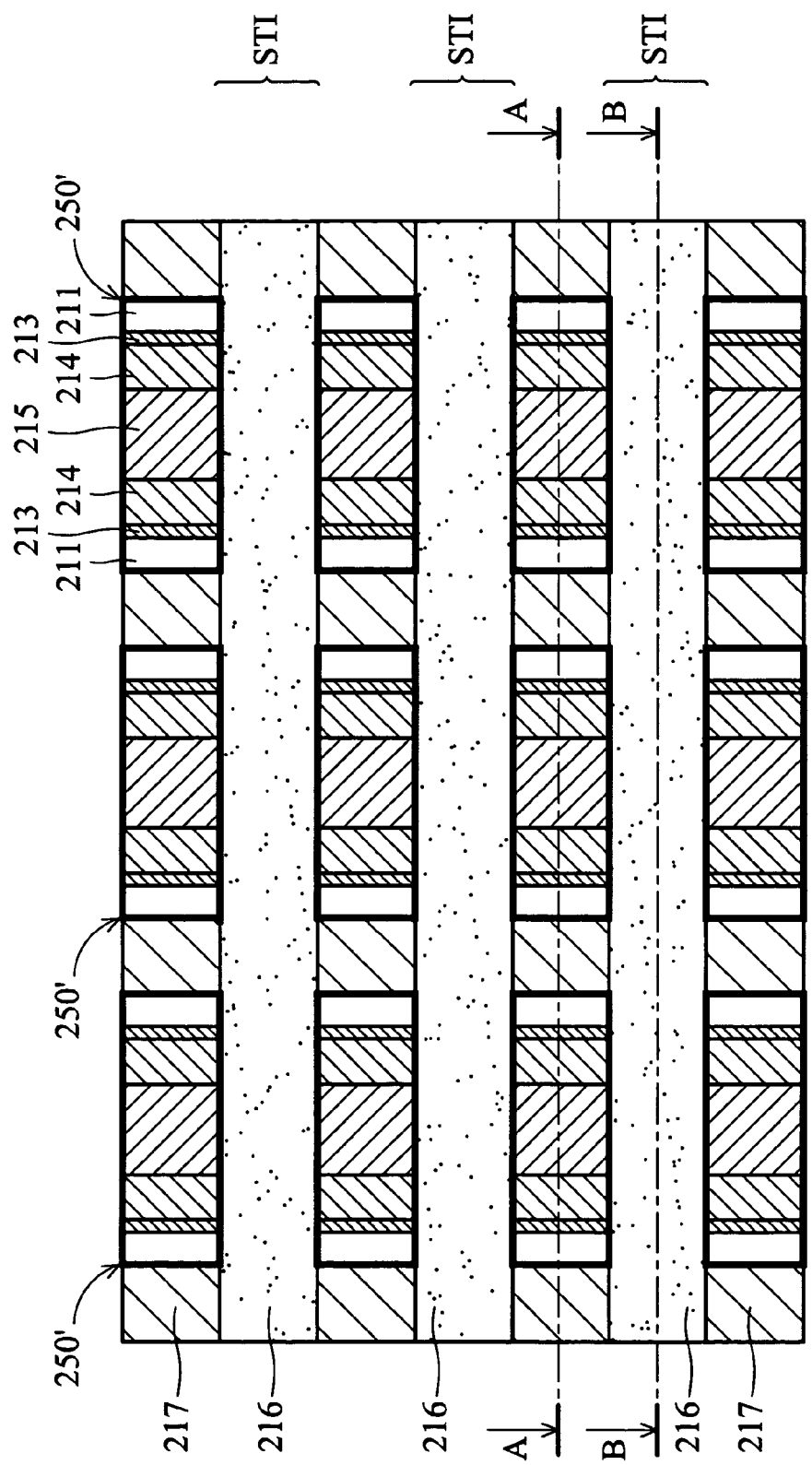

This top view is shown in FIG. 2d, drain regions D are covered by the fourth insulating layer 217, memory structures in each cell trench (the trench 250') expose a pair of second spacers 211, inter-gate dielectric layer 213 and second control gate layer 214 symmetrical to the second insulating layer 215 disposed in the substrate 200. The third insulating layer 216 is located in the shallow trench isolation (STI) region thereby.

In FIG. 1, a top view illustrating possible follow-up wordline BL and bitline WL is shown. In FIG. 1, the control gates (referring to the control gate layer 214) within the cell trenches (referring to trench 250') can be further connected by the interconnecting hypothesis wordlines WL and hypothesis bitlines BL in phantom structures. In addition, the bitlines BL can also connect the drain regions (referring to the regions below the fourth insulating layer 217) by a proper contact window (not shown) and the stacked gate flash memory devices are thus formed.

Compared with flash memory cell of the Prior Art, the present invention has the following advantages.

First, the flash memory devices in accordance with the invention are trench-type stacked gate flash memory devices having two symmetrical memory structures disposed in each cell trench within a substrate rather than those normally disposed on the surface of a substrate as in the Prior Art. Memory device design of the invention achieves higher integration of memory cell capacity than that in the Prior Art.

In addition, most of the fabricating processes in the invention are self-aligned. Thus, additional lithography processes and the number of masks for the whole fabricating process can be reduced. The complexity of fabricating the stacked gate flash memory device of the present invention is reduced and can be easily achieved.

Second, cells of the stacked gate flash memory device of the present invention are formed in the substrate. Thus, the size of each flash memory cell can be minimized and integration increased, as can capacity and the current within a cell by increasing the depth of the cell trench. Furthermore, most patterns of the masks for fabricating the stacked gate flash memory device are rectangular and can be easily fabricated. The costs of mask fabrication and resolution limitations by the photolithography tools are reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating stacked gate flash memory cells, comprising the steps of:
    providing a substrate;
    forming a plurality of parallel long trenches along a first direction in the substrate;
    forming a conductive layer and a pair of source regions on a bottom of each long trench, wherein the source regions are respectively disposed in the substrate adjacent to two sidewalls of each long trench and electrically connected to the conductive layer;
    forming a source isolation layer on each conductive layer;
    forming a tunnel oxide layer on two sidewalls of each long trench, contacting the source region thereby;
    forming a pair of floating gates on the source isolation layer, respectively contacting the tunnel oxide layer;
    forming a pair of inter-gate dielectric layers, respectively overlying the floating gate;
    forming a pair of control gates, respectively overlying the inter-gate dielectric layer;
    forming an insulating layer in each long trench, isolating the control gates;
    forming a plurality of parallel shallow trench isolation (STI) regions along a second direction, defining a plurality of cell trenches; and
    forming a drain region in the substrate adjacent to each cell trench.

2. The method as claimed in claim 1, wherein the first direction is perpendicular to the second direction.

3. The method as claimed in claim 1, wherein the substrate is P-type silicon substrate.

4. The method as claimed in claim 1, further comprising, before forming a plurality of parallel long trenches along a first direction in the substrate, the step of sequentially forming a pad oxide layer and a mask layer on the substrate.

5. The method as claimed in claim 4, wherein the mask layer is silicon nitride.

6. The method as claimed in claim 1, wherein the source isolation layer is sequentially formed by LPCVD and HDPCVD.

7. The method as claimed in claim 1, further comprising, before forming a conductive layer and a pair of source regions on the bottom of each long trench, the step of forming a bottom insulating layer in the bottom of each long trench.

8. The method as claimed in claim 7, wherein forming a conductive layer and a pair of source regions on the bottom of each long trench further comprises the steps of:
    forming a source line material layer in each long trench, exposing portions of the bottom insulating layer therein;
    removing the exposed bottom insulating layer, partially exposing the sidewalls of each long trench;
    forming a first spacer on the sidewalls of each long trench;
    etching the source line material layer, exposing portions of the bottom insulating layer adjacent to sidewalls of each long trench;
    removing the exposed bottom insulating layer, respectively forming a first sidewall gap on the sidewalls of each long trench;
    conformally depositing a polysilicon layer in each long trench, filling the first sidewall gaps;
    performing a thermal annealing process, forming a pair of source regions in the substrate adjacent to two sidewalls of each long trench; and
    etching the polysilicon layer, leaving portions of the polysilicon layer in the first sidewall gaps adjacent to the source line material layer, forming a conductive layer composed of the source material layer and the adjacent polysilicon layers in each long trench, wherein the source regions are electrically connected with the conductive layer.

9. The method as claimed in claim 8, wherein the method for depositing the source line material layer is chemical vapor deposition (CVD).

10. The method as claimed in claim 8, wherein the method for removing the exposed bottom insulating layer is wet etching.

11. The method as claimed in claim 1, further comprising, before forming a tunnel oxide layer on two sidewalls of each long trench, the step of performing a threshold voltage implantation on the sidewalls of each long trench.

12. The method as claimed in claim 1, wherein forming a pair of floating gates on the source isolation layer, and thereby respectively contacting the tunnel oxide layer further comprises the steps of:
    conformally depositing a second polysilicon layer in each long trench, contacting the tunnel oxide layers therein;
    forming a protective layer in each long trench, exposing portions of the second polysilicon layer;
    removing portions of the second polysilicon layer exposed by the protective layer, forming a U-shaped second polysilicon layer therein;
    forming a pair of second spacers, respectively disposed on the vertical portions of the U-shaped second polysilicon layer;
    removing the protecting layer;
    conformally depositing a third polysilcon layer in each long trench; and
    etching the third polysilicon layer and the U-shaped second polysilicon layer until the source isolation layer is exposed, leaving a composite polysilicon layer composed of the second polysilicon layer and the third polysilicon layer on the two sides of the long trench as a floating gate, wherein the floating gate is L-shaped or reverse L-shaped (⌐).

13. The method as claimed in claim 12, wherein the protecting layer is boro-silicate-glass (BSG).

14. The method as claimed in claim 12, wherein the method for depositing the second spacers is LPCVD.

15. The method as claimed in claim 12, wherein the second spacer is silicon dioxide.

16. The method as claimed in claim 1, wherein forming a plurality of parallel shallow trench isolation (STI) regions along a second direction, defining a plurality of cell trenches, further comprises the steps of:
   sequentially performing photolithography and etching, defining a plurality of parallel long isolation trenches along a second direction, stopping at the conductive layer therein; and
forming an third insulating layer in each long isolation trench.

17. The method as claimed in claim 16, wherein the third insulating layer is silicon dioxide.

18. The method as claimed in claim 16, wherein the method of forming the third insulating layer is low pressure chemical vapor deposition (LPCVD).

19. The method as claimed in claim 1, wherein forming a drain region in the substrate adjacent to each of the cell trenches further comprises the steps of:
   removing the mask layer and the pad oxide layer, exposing a plurality of active areas on the substrate;
   performing a drain implantation on the active areas;
   performing a thermal annealing process, forming a drain region in the substrate adjacent each cell trench; and
   forming a fourth insulating layer on each drain region.

20. The method as claimed in claim 19, wherein impurities used in the drain region implantation are N-type impurities.

21. The method as claimed in claim 20, wherein the N-type impurities comprise arsenic (As) ions.

22. The method as claimed in claim 19, wherein the thermal annealing process is rapid thermal annealing (RTA) process.

23. The method as claimed in claim 19, wherein the fourth insulating layer is a silicon dioxide layer.

24. The method as claimed in claim 19, the method for forming the fourth insulating layer is high density plasma chemical vapor deposition (HDP CVD).

* * * * *